United States Patent [19]
Goto

[11] Patent Number: 5,060,199
[45] Date of Patent: Oct. 22, 1991

[54] SEMICONDUCTOR DEVICE WITH COMPONENT CIRCUITS UNDER SYMMETRIC INFLUENCE OF UNDESIRABLE TURBULENCE

[75] Inventor: Hiroyuki Goto, Tokyo, Japan

[73] Assignee: NEC Corporation, Tokyo, Japan

[21] Appl. No.: 382,890

[22] Filed: Jul. 21, 1989

[30] Foreign Application Priority Data

Jul. 26, 1988 [JP] Japan .................. 63-186001

[51] Int. Cl.$^5$ .............................................. G11C 7/00
[52] U.S. Cl. ..................................... 365/203; 365/63; 365/51
[58] Field of Search ............... 365/203, 154, 155, 156, 365/190, 202, 207, 208, 51, 63, 206; 357/68, 71

[56] References Cited

U.S. PATENT DOCUMENTS 4,730,280  3/1988  Aoyama .............................. 365/190

Primary Examiner—Joseph A. Popek
Attorney, Agent, or Firm—Sughrue, Mion, Zinn, Macpeak & Seas

[57] ABSTRACT

A precharging circuit of a semiconductor memory device has a plurality of precharging transistors arranged in rows and columns and respectively associated with bit line pairs, and each of the bit line pairs is coupled to two of the precharging transistors in the same row, so that these precharging transistors are substantially equivalent in the electric influences of another component conductive strips passing in a direction substantially in parallel to the row direction.

5 Claims, 4 Drawing Sheets

SEMICONDUCTOR DEVICE WITH COMPONENT CIRCUITS UNDER SYMMETRIC INFLUENCE OF UNDESIRABLE TURBULENCE

FIELD OF THE INVENTION

This invention relates to a semiconductor device and, more particularly, to a layout of the component circuits incorporated in the semiconductor device.

DESCRIPTION OF THE RELATED ART

FIG. 1 shows a typical example of the component elements incorporated in the semiconductor device, and reference numerals 1 and 2 designate static memory cells respectively associated with bit line pairs 3 and 4. The bit line pairs 3 and 4 respectively propagate data bits read out from or written into the memory cells 1 and 2, and each of the data bits is in the form of a difference in voltage level. For this reason, the bit line pairs are respectively constituted by first bit lines 3a and 4a paired with second bit lines 3b and 4b.

The bit line pairs 3 and 4 are coupled to a precharging circuit 5 provided with p-channel type field effect transistors 6, 7, 8 and 9, and the p-channel type field effect transistors 6 to 9 are respectively coupled between the bit lines 3a, 3b, 4a and 4b and a source of positive voltage level Vdd. A control signal line 10 is shared by the gate electrodes of the field effect transistors 6 to 9, and, for this reason, the p-channel type field effect transistors 6 to 9 are simultaneously turned on to charge up the bit lines 3a to 4b in the presence of a precharging signal of an active low voltage level.

The precharging circuit 5 thus coupled is fabricated on a type semiconductor substrate 11 together with the bit line pairs 3 and 4 as shown in FIG. 2. In the semiconductor substrate 11 are formed two p-channel type impurity regions 12 and 13 which are respectively divided into source regions and the drain regions by channel forming regions. A polysilicon layer 14 extends over the channel forming regions, and serves as the gate electrodes of the p-channel type field effect transistors 6 to 9.

The polysilicon layer 14 and the major surface of the semiconductor substrate 11 are covered with an insulating film 15, and the bit lines 3a, 3b, 4a and 4b are formed on the insulating film 15 together with lower metal conductive strips 16, 17 and 18. The lower metal conductive strip 16 provides the source of positive voltage level Vdd, and the other lower metal conductive strips are used for interconnections. The lower metal conductive strip 16 are coupled to the source regions of all the p-channel type field effect transistors 6 to 9 through contact windows formed in the insulating film 15, and supplies the source regions with the positive voltage level Vdd. The lower metal conductive strips 17 and 18 are coupled to the drain regions of the p-channel type field effect transistors 6 and 8 through contact windows also formed in the insulating film 15, respectively, however, the bit lines 3b and 4b are directly brought into contact with the drain regions of the p-channel type field effect transistors 7 and 9 through contact windows without any interconnection.

The bit lines 3a to 4b and the lower metal conductive strips 16 to 18 formed on the insulating film 15 are overlain by an inter-level insulating film 19, and upper metal conductive strips 20 and 21 are formed on the inter-level insulating film 19. The upper metal conductive film 20 interconnects the lower metal conductive strip 17 and the bit line 3a through contact windows 22 and 23 formed in the inter-level insulating film 19, and the upper metal conductive strip 21 is coupled at one end portion thereof to the lower metal conductive strip 18 through a contact window 24 and at the other end portion to the bit line 4a through a contact window 25. Reference numeral 26 designates another upper metal conductive strip formed on the inter-level insulating film 19, and extends over the p-channel type field effect transistors 6 and 8. In this prior art example, another component circuit such as a buffer circuit is located in the vicinity of the p-channel type field effect transistors 6 and 8.

However, a problem is encountered in the prior art semiconductor device in that the bit lines 3a and 4a are much liable to have influences of the upper metal conductive strip 26 and the buffer circuit 27 in comparison with the bit lines 3b and 4b. This is because of the facts that the bit lines 3a and 4a are capacitively coupled to the upper metal conductive line 26 and that the bit lines 3a and 4a and the bit lines 3b and 4b are different in space intervals from the buffer circuit 27. In detail, when the upper metal conductive strip 26 propagates a signal, the bit lines 3a and 4a are under influences of the signal due to the capacitive couplings, however, no influence takes place between the upper metal conductive strip 26 and the bit lines 3b and 4b. Moreover, if the buffer circuit is activated and, accordingly, a fluctuation takes place in the signals or the voltage level in the buffer circuit 27, undesirable noises are induced in the bit lines 3a and 4a, however, the bit lines 3b and 4b are free from the fluctuation. Thus, the bit lines 3a and 4a are different in the influences of the other components from the bit lines 3b and 4b, and, for this reason, the data bits on the bit lines pairs are liable to be destroyed. These data bits are causative of mis-operations.

SUMMARY OF THE INVENTION

It is therefore an important object of the present invention to provide a semiconductor memory device the component elements of which is less liable to have influences of other component elements.

It is also important object of the present invention to provide a semiconductor device the layout of which prevents the component elements from the influences of the other component elements.

To accomplish these objects, the present invention proposes to arrange the component elements in a symmetric manner with respect to an influence source.

In accordance with the present invention, there is provided a semiconductor device fabricated on a semiconductor substrate and having a plurality of component circuits of an integrated circuit and at least one component conductive strip operative to propagate a first electric signal, one of the component circuits comprising a) a first pair of component elements operative to produce a second electric signal and the complementary electric signal thereof and arranged in such a manner as to be substantially equivalent in an electrical influence of the component conductive strip to each other, and b) a second pair of component elements operative to produce a third electric signal and arranged in such a manner as to be substantially equivalent in the electric influence of the component conductive strip, the first pair of the component elements are different in the electric influence of the component conductive strip from the second pair of the component elements.

BRIEF DESCRIPTION OF THE DRAWINGS

The features and advantages of a semiconductor device according to the present invention will be more clearly understood from the following description taken in conjunction with the accompanying drawings in which.

DESCRIPTION OF THE PREFERRED EMBODIMENTS

First embodiment

Figure 1:
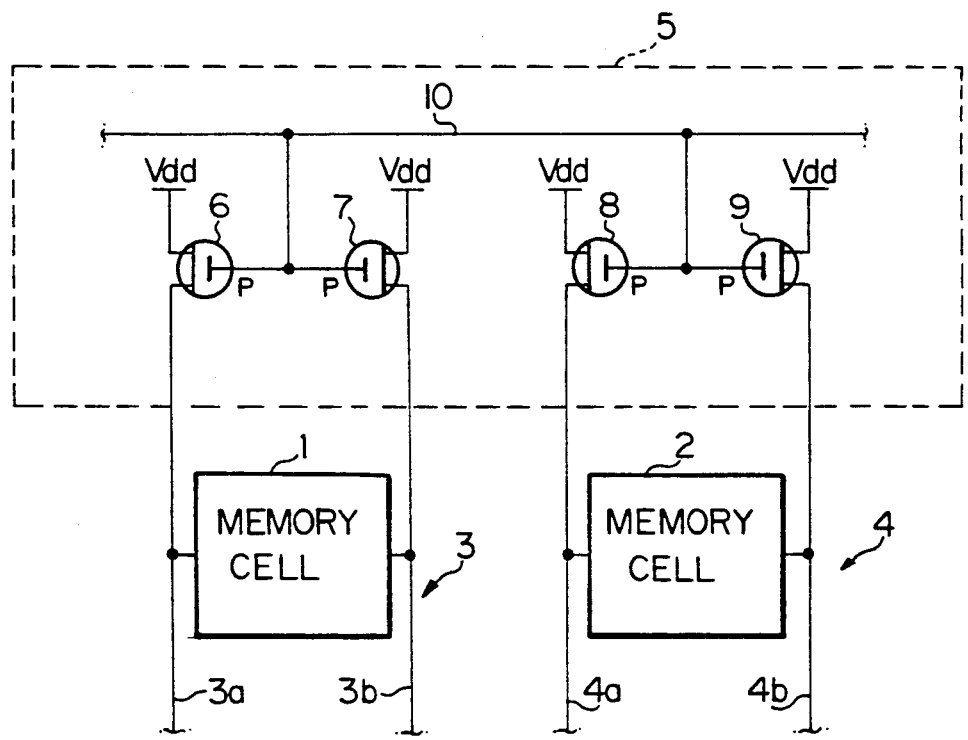
FIG. 1 is a circuit diagram showing the arrangement of component circuits incorporated in a prior :rt semiconductor device.
Figure 2:
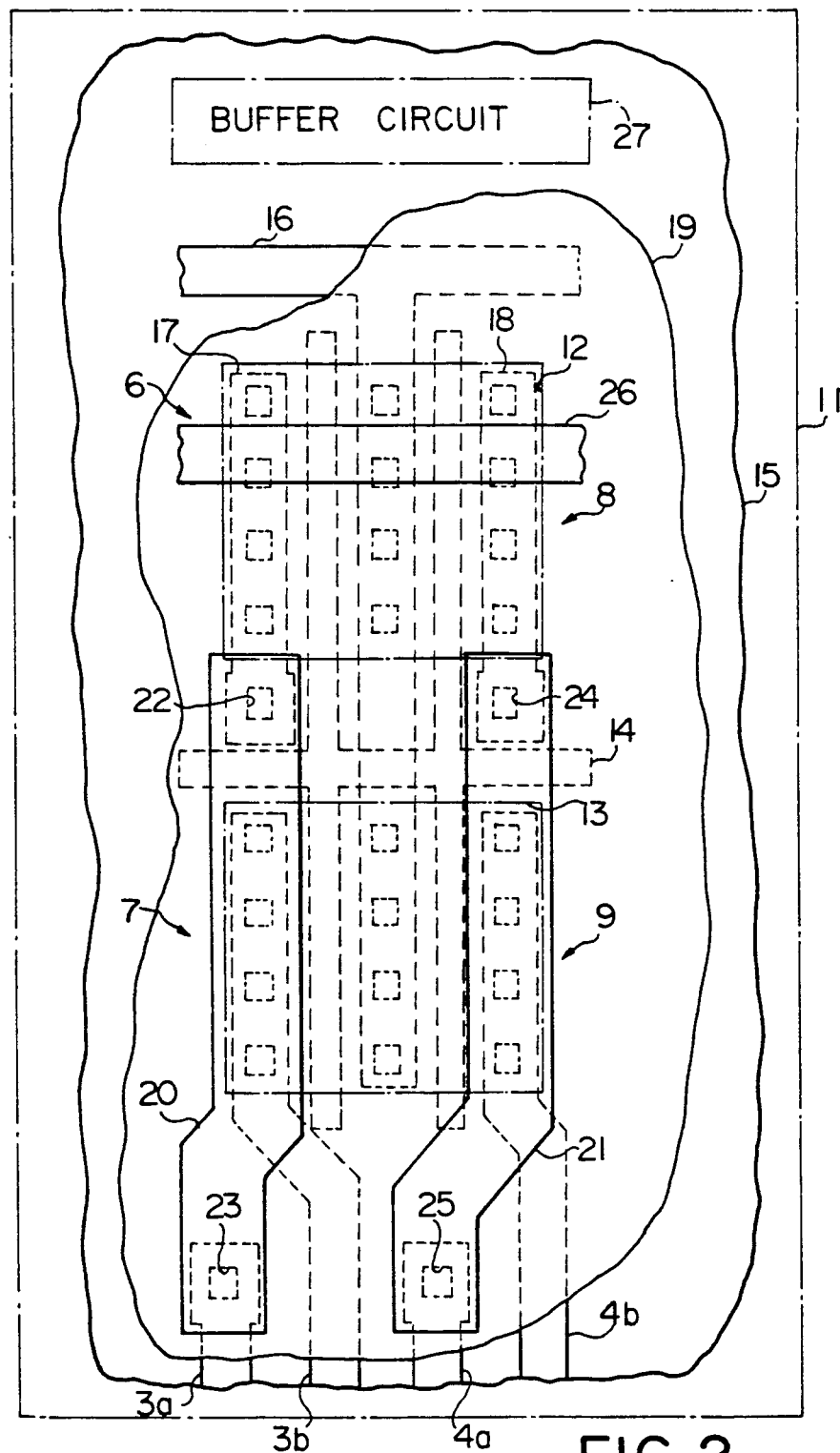
FIG. 2 is a partially cut-away plan view showing the layout of the component circuit shown in FIG. 1.
Figure 3:
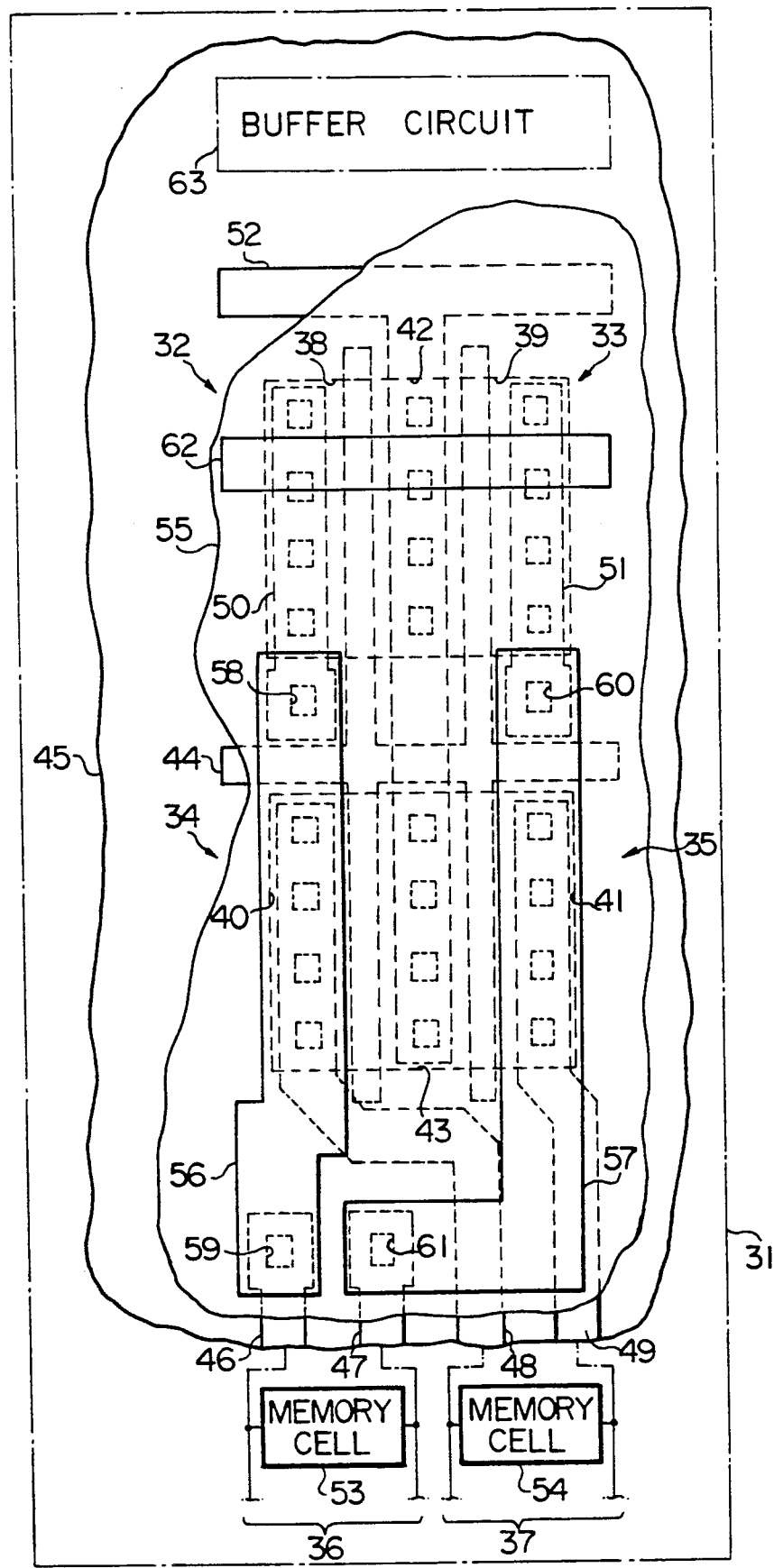
FIG. 3 is a partially cut-away plan view showing the layout of a part of a semiconductor device embodying &he present invention.

Referring first to FIG. 3 of the drawing, a precharging circuit is fabricated on a semiconductor substrate 31 in a different layout. FIG. 3 only shows four p-channel type field effect transistors 32, 33, 34 and 35 forming parts of the precharging circuit and associated with two bit line pairs 36 and 37, however, more than four p-channel type field effect transistors are provided in association of a large number of bit line pairs. The precharging circuit forms a part of an integrated circuit.

In an n-type surface portion of the semiconductor substrate 31 are formed four p-channel type impurity regions 38, 39, 40 and 41 which respectively provide drain regions of the field effect transistors 32 to 35 and are arranged in rows and columns. Two p-channel type common source regions 42 and 43 are formed between the drain regions 38 and 39 and between the source regions 40 and 41, respectively. Channel forming regions are located between the common source region 42 and the drain regions 38 and 39 and between the common source region 43 and the drain regions 40 and 41, respectively. A lattice-shaped polysilicon layer 44 extends over gate insulating films respectively formed on the channel forming regions, and serves as the gate electrodes of the p-channel type field effect transistors 32 to 35.

The polysilicon layer 44 and the major surface of the semiconductor substrate 31 are covered with an insulating film 45, and the bit lines 46, 47, 48 and 49 are formed on the insulating film 45 together with lower metal conductive strips 50, 51 and 52. The bit lines 46 and 47 form in combination the bit line pair 36 coupled to a plurality of memory cells including a memory cell 53, and, in a similar manner, the bit lines 48 and 49 as a whole constitute the bit line pair 37 coupled to memory cells in a column one of which is designated by reference numeral 54. The memory cells 53 and 54 are of the static type and readably memorize data bits each in the form of difference in voltage level. Each of the bit line pairs 36 and 37 propagates each data bit in the form of the difference in voltage level or a voltage signal and the complementary signal thereof, and, for this reason, the bit line pair 36 or 37 and, accordingly, the associated p-channel type field effect transistors 32 and 33 or 34 and 35 should be symmetry in an electric influence of another component element, because the voltage signal and the complementary signal thereof keep symmetrical in the waveforms for avoiding :ny mis-operation.

The lower metal conductive strip 52 provides the source of positive voltage level Vdd, and the other lower metal conductive strips 50 and 51 are used for interconnections. The lower metal conductive strip 52 are coupled to the common source regions 42 and 43 of all the p-channel type field effect transistors 32 to 35 through contact windows formed in the insulating film 45, and supplies the source regions with the positive voltage level Vdd. In the drawings, all of the contact windows are indicated by small squares, respectively. The lower metal conductive strips 50 and 51 are coupled to the drain regions 38 and 39 of the p-type field effect transistors 32 and 33 through contact windows also formed in the insulating film 45, respectively, however, the bit lines 48 and 49 are directly brought into contact with the drain regions 40 and 41 of the p-channel type field effect transistors 34 and 35 through contact windows without any interconnection.

The bit lines 46 to 49 and the lower metal conductive strips 50 to 52 formed on the insulating film 45 are overlain by an inter-level insulating film 55, and upper metal conductive strips 56 and 57 are formed on the inter-level insulating film 55. The upper metal conductive strip 56 interconnects the lower metal conductive strip 50 and the bit line 46 through contact windows 58 and 59 formed in the inter-level insulating film 55, and the upper metal conductive strip 57 is coupled at one end portion thereof to the lower metal conductive strip 51 through a contact window 60 and at the other end portion to the bit line 47 through a contact window 61. Reference numeral 62 designates another upper metal conductive strip formed on the inter-level insulating film 55, and extends over the p-channel type field effect transistors 32 and 33. In this example, another component circuit such as a buffer circuit is located in the vicinity of the p-channel type field effect transistors 32 and 33, and is designated by reference numeral 63.

Since the p-channel type field effect transistors associated with the bit line pair 36 are located in the same row, the field effect transistors 32 and 33 and, accordingly, the bit line pair 36 are substantially equivalent in electric influences of the upper metal conductive strip 62 even if the upper metal conductive strip 62 extends over the field effect transistors 32 and 33, and is capacitively coupled thereto. This results in that the voltage signal and the complementary signal thereof on the bit line pair 36 are symmetrically varied in the waveforms even if the field effect transistors and the bit line pair 36 are subjected to any electrical influences of the upper metal conductive strip 62. In addition, the field effect transistors 32 and 33 and the bit line pair 36 are different in the electric influences from the field effect transistors 34 and 35 and the associated bit line pair 37, however, no serious problem takes place in the operation of the integrated circuit, because the electric signals on the bit line pairs 36 and 37 are independent from each other.

Similarly, the field effect transistors 32 and 33 are so symmetrical with respect to the buffer circuit (3 that any electric turbulences of the buffer circuit have the same influences to the field effect transistors and, accordingly, to the bit lines 46 and 47. This also results in the stable operation of the integrated circuit. In this instance, the buffer circuit 63 and the precharging circuit with the p-type field effect transistors 32 and 35 serve as a plurality of component circuits, and the metal conductive strip 62 serves as at least one component conductive strip. The pair of p-channel type field effect transistors 32 and 33 and the pair of p-channel type field effect transistors 34 and 35 serve as first and second pairs of component elements.

Second embodiment

Figure 4:
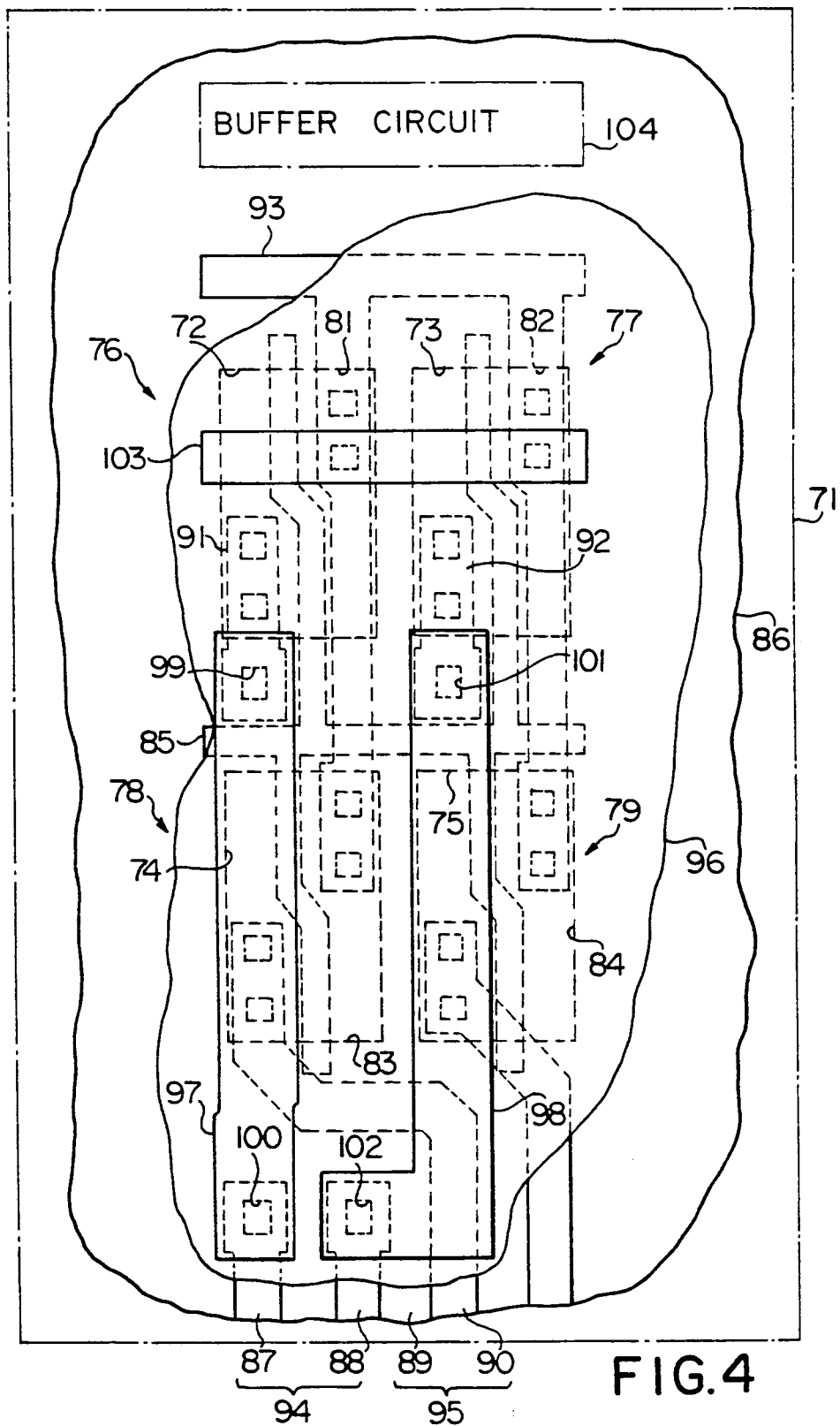
FIG. 4 is a partially cut-away plan view showing the layout of a part of another semiconductor device embodying the present invention.

Turning to FIG. 4, another layout is illustrated and realized on a semiconductor substrate 71. In an n-type surface portion of the semiconductor substrate 71 are formed four p-channel type impurity regions 72, 73, 74 and 75 which respectively provide drain regions of field effect transistors 76, 77, 78 and 79 and are arranged in rows and columns. Four p-channel type source regions 80, 81, 82, 83 and 84 are formed on the right sides of the drain regions 72 to 75, respectively. Channel forming regions are located between the drain regions 72 to 75 and the source regions 81 to 84, respectively. A polysilicon layer extends over gate insulating films respectively formed on the channel forming regions, and serves as the gate electrodes of the p-channel type field effect transistors 76 to 79.

The polysilicon layer 85 and the major surface of the semiconductor substrate 71 are covered with an insulating film 86, and the bit lines 87, 88, 89 and 90 are formed on the insulating film 86 together with lower metal conductive strips 91, 92 and 93. The bit lines 87 and 88 form in combination a bit line pair 94 coupled to a plurality of memory cells, and, in a similar manner, the bit lines 89 and 90 as a whole constitute a bit line pair 95 coupled to memory cells in a column. The memory cells are of the static type and readably memorize data bits each in the form of difference in voltage level. Each of the bit line pairs 94 and 95 propagates each data bit in the form of the difference in voltage level or a voltage signal and the complementary signal thereof, and, for this reason, the bit line pair 94 or 95 and, accordingly, the associated p-channel type field effect transistors 76 and 77 or 78 and 79 should be symmetry in an electric influence of another component element, because the voltage signal and the complementary signal thereof keep symmetrical in the waveforms for avoiding any mis-operation.

The lower metal conductive strip 93 provides the source of positive voltage level Vdd, and the other lower metal conductive strips 91 and 92 are used for interconnections. The lower metal conductive strip 93 are coupled to the source regions 81 to 84 through contact windows formed in the insulating film 86, and supplies the source regions 81 to 84 with the positive voltage level Vdd. The lower metal conductive strips 91 and 92 are coupled to the drain regions 72 and 73 of the p-channel type field effect transistors 76 and 77 through contact windows also formed in the insulating film 86, respectively, however, the bit lines 89 and 90 are directly brought into contact with the drain regions 74 and 75 of the p-channel type field effect transistors 78 and 79 through contact windows without any interconnection.

The bit lines 87 to 90 and the lower metal conductive strips 91 to 93 formed on the insulating film 86 are overlain by an inter-level insulating film 96, and upper metal conductive strips 97 and 98 are formed on the inter-level insulating film 96. The upper metal conductive strip 97 interconnects the lower metal conductive strip 91 and the bit line 87 through contact windows 99 and 100 formed in the inter-level insulating film 96, and the upper metal conductive strip 98 is coupled a& one end portion thereof to the lower metal conductive strip 92 through a contact window 101 and at the other end portion to the bit line 88 through a contact window 102. Reference numeral 103 designates another upper metal conductive strip formed on the inter-level insulating film 96, and extends over the p-channel type field effect transistors 76 and 77. In this example, another component circuit such as a buffer circuit is located in the vicinity of the p-channel type field effect transistors 76 and 77, and is designated by reference numeral 104. The layout illustrated in FIG. 4 is also arranged in symmetrical with respect to the upper metal conductive strip 103 and to the buffer circuit 104, and, for this reason, no serious influence takes place in the operation of the integrated circuit. In this instance, each transistor pair has the component transistors where currents flow from the sources to the drains in the same direction, and, for this reason, the currents hardly have any influences of the cristal orientation of the substrate as well as any influences of deviations in the diffusion stages, thereby preventing the component transistors from any differences in the characteristics.

Although particular embodiments of the present invention have been shown and described, it will be obvious to those skilled in the art that various changes and modifications may be made without departing from the spirit and scope of the present invention.

What is claimed is

1. A semiconductor device fabricated on a semiconductor substrate and having a plurality of component circuits of an integrated circuit and at least one component conductive strip operative to propagate a first electric signal, one of said component circuits comprising
    a) a first pair of component elements operative to produce a second electric signal and the complementary electric signal thereof and arranged in such a manner as to be substantially equivalent in an electrical influence of said component conductive strip to each other, and
    b) a second pair of component elements operative to produce a third electric signal and arranged in such a manner as to be substantially equivalent in the electric influence of said component conductive strip, said first pair of said component elements are different in the electric influence of said component conductive strip from said second pair of said component elements, in which said first pair of said component elements are substantially equivalent in an electric influence of another component circuit to each other, and in which said second pair of said component elements are substantially equivalent in he electric influence of aforesaid another component circuit to each other, wherein said first pair of said component elements are different in the electric influence of aforesaid another circuit from said second pair of said component elements.

2. A semiconductor device as set forth in claim 1, in which said first and second pairs of said component elements form in combination a precharging circuit coupled to first and second bit line pairs.

3. A semiconductor device as set forth in claim 2, in which said first pair of said component elements are first and second field effect transistors coupled in parallel between a voltage supply line and said first bit line pair, and in which said second pair of said component elements are third and fourth field effect transistors coupled in parallel between said voltage supply line and said second bit line pair.

4. A semiconductor device as set forth in claim 3, in which said first to fourth field effect transistors are concurrently responsive to an activation signal supplied to the gate electrodes thereof.

5. A semiconductor device fabricated on a semiconductor substrate and having a plurality of component circuits of an integrated circuit and at least one component conductive strip extending in a row direction, comprising:
   a) a plurality of drain regions formed in a surface portion of said semiconductor substrate and arranged in rows and columns;
   b) a plurality of source regions formed in the surface portion of said semiconductor substrate and arranged in rows and columns, each of said source regions being paired with each drain region and located between two adjacent drain regions in the same row, channel forming regions being formed between said drain regions and said associated source regions, respectively;
   c) a polysilicon strip formed on gate insulating films on said channel forming regions and serving as a common gate electrode;
   d) a lower insulating film covering said drain and source regions and said polysilicon strip;
   e) a first bit line pair consisting of first and second bit lines extending on said lower insulating film;
   f) a second bit line pair consisting of third and fourth bit lines extending on said lower insulating film and coupled to two of the drain regions in one of said rows through contact windows formed in said lower insulating film;
   g) a first metal conductive strip formed on said lower insulating film and coupled to all of said source regions through contact windows formed in the lower insulating film;
   h) second and third metal conductive strips respectively formed on portions of said lower insulating film over two of the drain regions in another row, and respectively coupled thereto through contact windows formed in the lower insulating film;
   i) an inter-level insulating film covering said first to fourth bit lines and said first to third metal conductive strips;
   j) a first upper metal conductive strip interconnecting said second metal conductive strip and said first lit line through contact windows formed in said inter-level insulating film; and
   k) a second upper metal conductive strip interconnecting said third metal conductive strip and said second lit line through contact windows formed in said inter-level insulating film, in which said at least one component conductive strip is formed on said inter-level insulating film and extends substantially in parallel to aforesaid another row of said drain regions.

* * * * *